US012750953B2

(12) United States Patent
Jeong et al.

(10) Patent No.: US 12,750,953 B2
(45) Date of Patent: Sep. 29, 2026

(54) CIRCUIT BOARD AND MANUFACTURING METHOD THEREOF

(71) Applicant: SAMSUNG ELECTRO-MECHANICS CO., LTD., Suwon-si (KR)

(72) Inventors: Sangho Jeong, Suwon-si (KR); Jongeun Park, Suwon-si (KR); Yongduk Lee, Suwon-si (KR); Kihwan Kim, Suwon-si (KR); Changhwa Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 262 days.

(21) Appl. No.: 18/242,843

(22) Filed: Sep. 6, 2023

(65) Prior Publication Data

US 2024/0334601 A1 Oct. 3, 2024

(30) Foreign Application Priority Data

Mar. 31, 2023 (KR) ........................ 10-2023-0043105

(51) Int. Cl.

*H05K 1/11* (2006.01)
*H05K 1/02* (2006.01)
*H05K 3/42* (2006.01)

(52) U.S. Cl.

CPC ........... *H05K 1/115* (2013.01); *H05K 1/0298* (2013.01); *H05K 3/429* (2013.01); *H05K 2201/09545* (2013.01); *H05K 2201/09827* (2013.01)

(58) Field of Classification Search

CPC ...... H05K 1/115; H05K 1/0298; H05K 3/429; H05K 2201/09545; H05K 2201/09827;

(Continued)

(56) References Cited

U.S. PATENT DOCUMENTS 8,263,878 B2 * 9/2012 Takenaka ............. H05K 1/0271 174/262
8,492,659 B2 * 7/2013 Nagase ................ H05K 3/0035 174/262

(Continued)

FOREIGN PATENT DOCUMENTS

JP 2004-281481 A 10/2004
JP 2014-222733 A 11/2014

(Continued)

OTHER PUBLICATIONS

Office Action dated Apr. 27, 2026 in corresponding Korean Patent Application No. 10-2023-0043105 with English translation.

*Primary Examiner* — Timothy J Thompson
(74) *Attorney, Agent, or Firm* — Morgan, Lewis & Bockius LLP

(57) ABSTRACT

A circuit board includes a first insulation layer, a circuit wire positioned on the first insulation layer, a second insulation layer covering the circuit wire and overlapping a portion of the circuit wire, and having a via hole including a first side wall and a second side wall having different tilt angles and extending in the thickness direction of the first insulation layer, a first seed layer covering the first side wall and the second side wall of the via hole, a second seed layer positioned in the via hole and covering the first seed layer, a third seed layer positioned on an upper surface of the second insulation layer and including the same material as the second seed layer, a first conductive layer positioned on the second seed layer, and a second conductive layer positioned on the third seed layer.

12 Claims, 7 Drawing Sheets

(58) Field of Classification Search
CPC ........ H05K 3/108; H05K 3/4644; H05K 1/02; H05K 1/0296; H05K 3/0011; H05K 3/10; H05K 3/4038; H05K 3/42; H05K 3/0026; H05K 3/16; H05K 3/281
See application file for complete search history.

(56) References Cited

U.S. PATENT DOCUMENTS

| | | | | |
|---|---|---|---|---|
| 2009/0188806 | A1* | 7/2009 | Yamasaki .............. | H05K 3/108 205/122 |
| 2009/0211799 | A1 | 8/2009 | Nagase et al. | |
| 2011/0061916 | A1* | 3/2011 | Yamasaki .............. | H05K 3/388 29/846 |
| 2021/0202303 | A1 | 7/2021 | Kim et al. | |

FOREIGN PATENT DOCUMENTS

| | | | |
|---|---|---|---|
| KR | 10-2020-0013471 | A | 2/2020 |
| KR | 10-2021-0083830 | A | 7/2021 |

* cited by examiner

CIRCUIT BOARD AND MANUFACTURING METHOD THEREOF

CROSS-REFERENCE TO RELATED APPLICATION

This application claims priority to and the benefit of Korean Patent Application No. 10-2023-0043105 filed in the Korean Intellectual Property Office on Mar. 31, 2023, the entire contents of which are incorporated herein by reference.

TECHNICAL FIELD

The present disclosure relates to a circuit board and a manufacturing method thereof.

BACKGROUND

Recently, the need for highly integrated circuit boards has led to the implementation of microcircuits. In order to implement microcircuits, the thickness of the seed layer must be reduced, but the general chemical copper plating process has limitations, so a sputtering process is used to form a low-thickness seed layer.

However, if the depth of a via hole is deep, the seed layer formed by the sputtering process inside the via hole has poor coverage. In other words, the coverage decreases toward the bottom of the via hole, which can result in unplated regions inside the via hole. Under these conditions, if a conductive layer is formed by the plating process using the seed layer inside the via hole as a seed, poor voids may occur in the unplated region.

SUMMARY

The present disclosure attempts to provide a circuit board and a manufacturing method thereof capable of improving coverage of a seed layer positioned inside a via hole to minimize defects.

However, embodiments of the present disclosure are not limited to those mentioned above and may be variously extended in the scope of the technical ideas included in the present disclosure.

A circuit board according to an embodiment includes a first insulation layer, a circuit wire positioned on the first insulation layer, a second insulation layer covering at least a portion of the circuit wire and overlapping at least a portion of the circuit wire, and having a via hole including a first side wall and a second side wall having different tilt angles and extending in the thickness direction of the first insulation layer, a first seed layer covering the first side wall and the second side wall of the via hole, a second seed layer positioned in the via hole and covering the first seed layer, a third seed layer positioned on an upper surface of the second insulation layer and including the same material as the second seed layer, a first conductive layer positioned on the second seed layer, and a second conductive layer positioned on the third seed layer.

The first side wall extends from an upper part surface of the second insulation layer, and the second side wall may extend from the first side wall to an upper part surface of the circuit wire.

A first tilt angle of the first side wall relative to the upper part surface of the circuit wire may be smaller than a second tilt angle of the second side wall.

A length of the first side wall may be shorter than a length of the second side wall.

The first seed layer includes a first upper part seed layer covering the first side wall, a first lower part seed layer covering the second side wall, and a first bottom seed layer covering an upper part surface of the circuit wire, the thickness of the first bottom seed layer may be uniform.

A maximum thickness of the first upper part seed layer may be thicker than a maximum thickness of the first lower part seed layer.

The second seed layer includes a second upper part seed layer covering the first upper part seed layer, a second lower part seed layer covering the first lower part seed layer, and a second bottom seed layer covering the first bottom seed layer, the thickness of the second bottom seed layer may be not uniform.

The first conductive layer and the second conductive layer may include the same material.

The first conductive layer may be in contact with a portion of the first seed layer.

A manufacturing method according to an embodiment includes forming a circuit wire on a first insulation layer, forming an insulation layer on the first insulation layer to cover the circuit wire and including a second insulation layer and a protection film covering the second insulation layer, forming a via hole in the insulation layer overlapping at least a portion of the circuit wire, forming a first seed layer covering a side wall of the via hole and an upper part surface of the protection film using a chemical copper plating process, removing the protection film, and forming a second seed layer and a first conductive layer on the first seed layer.

The forming of the second seed layer and the first conductive layer may further include forming a sputtering seed layer covering the first seed layer using a sputtering process, forming a resist layer on the sputtering seed layer having a first opening corresponding to the first seed layer, forming the first conductive layer on a first portion of the sputtering seed layer positioned in the first opening using a plating process, removing the resist layer, and performing an etching process to form the second seed layer overlapping the first conductive layer.

Covering an upper part surface of the second insulation layer by a second portion of the sputtering seed layer in the sputtering process, and forming a second conductive layer on the second portion of the sputtering seed layer in the plating process are further included, wherein the second conductive layer may be formed through a second opening of the resist layer corresponding to the second portion of the sputtering seed layer.

A manufacturing method according to an embodiment may include forming the second seed layer and simultaneously forming a third seed layer overlapping the second conductive layer.

A manufacturing method according to an embodiment may include removing residue generated inside the via hole by using a surface treatment process. In the surface treatment process, a concave first sidewall may be formed in a portion of the sidewall of the via hole adjacent to the protection film.

A first tilt angle of the first side wall relative to an upper part surface of the circuit wire may be smaller than a second tilt angle of the second side wall which is the remaining portion.

The first seed layer may cover the first side wall and the second side wall, the second seed layer may cover all the first side wall and a portion of the second side wall.

The second seed layer and the third seed layer may be formed by etching a third portion of the sputtering seed layer that does not overlap with the first conductive layer and the second conductive layer.

The protection film may be removed and simultaneously a part of the first seed layer covering the upper part surface of the protection film may be removed.

A laser processing process may be used to form the via hole in the insulation layer.

A circuit board according to an embodiment includes a first insulation layer, a circuit wire positioned on the first insulation layer, a second insulation layer having a via hole covering at least a portion of the circuit wire and overlapping at least a portion of the circuit wire, a first seed layer covering a side wall of the via hole, a second seed layer positioned in the via hole and covering the first seed layer, a third seed layer positioned on an upper surface of the second insulation layer and including the same material as the second seed layer, a first conductive layer positioned on the second seed layer, and a second conductive layer positioned on the third seed layer and including the same material as the first conductive layer. A thickness of the third seed layer may be thinner than a thickness of the first seed layer.

According to embodiments, by performing a chemical copper plating process inside the via hole to form a seed layer before peeling off the protection film attached to the upper part surface of the insulation layer, thereby improving the coverage of the seed layer inside the via hole.

Therefore, the occurrence of unplated regions inside the via hole can be minimized to minimize defects, thereby ensuring the reliability of the conductive layer positioned inside the via hole.

In addition, by the protection film attached to the upper part surface of the insulation layer except for the via hole, the seed layer by the chemical copper plating process is not formed on the upper part surface of the insulation layer, but only the seed layer by the sputtering process is formed, thus the thickness of the seed layer on the upper part surface of the insulation layer can be reduced, making it easier to implement microcircuit patterns.

However, it will be appreciated that the effects of the embodiments are not limited to those described above and may be expanded in various ways without departing from the spirit and scope of the present disclosure.

DETAILED DESCRIPTION OF THE EMBODIMENTS

Figure 1:
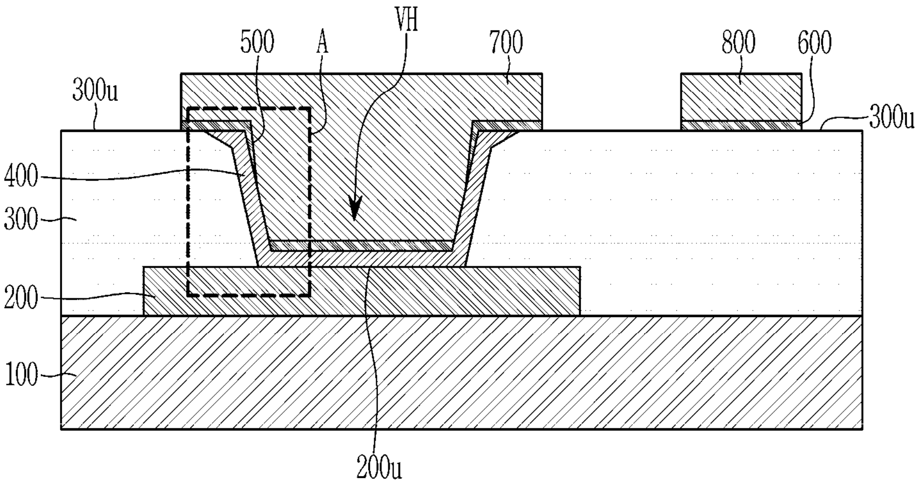
FIG. 1 is a cross-sectional view of a circuit board according to an embodiment.

Hereinafter, an embodiment of the present disclosure will be described in detail with reference to the accompanying drawings so that a person of an ordinary skill in the art can easily make it. As those skilled in the art would realize, the described embodiments may be modified in various different ways, all without departing from the spirit or scope of the present disclosure.

Accordingly, the drawings and description are to be regarded as illustrative in nature and not restrictive, and like reference numerals designate like constituent element throughout the specification.

The accompanying drawings are intended only to facilitate an understanding of the embodiments disclosed in this specification, and it is to be understood that the technical ideas disclosed herein are not limited by the accompanying drawings and include all modifications, equivalents, or substitutions that are within the range of the ideas and technology of the present disclosure.

Because the size and thickness of each configuration shown in the drawings are arbitrarily shown for better understanding and ease of description, the present disclosure is not limited thereto. In the drawings, the thickness of layers, films, panels, regions, etc., are exaggerated for clarity. In the drawings, the thickness of layers and regions may be exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on, above, or below the object portion and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Throughout the specification, the phrase "on a plane" means viewing the object portion from the top and the phrase "on a cross-section" means viewing a cross-section of which the object portion that vertically cut from the side.

Throughout the specification, the term "connected" does not mean only that two or more constituent components are directly connected, but may also mean that two or more constituent components are indirectly connected through another constituent component, that two or more components are electrically connected as well as physically connected, or that two or more constituent components are referred to by different names but are united by location or function.

Hereinafter, various embodiments and exemplary variations are described in detail with reference to the drawings.

Figure 2:
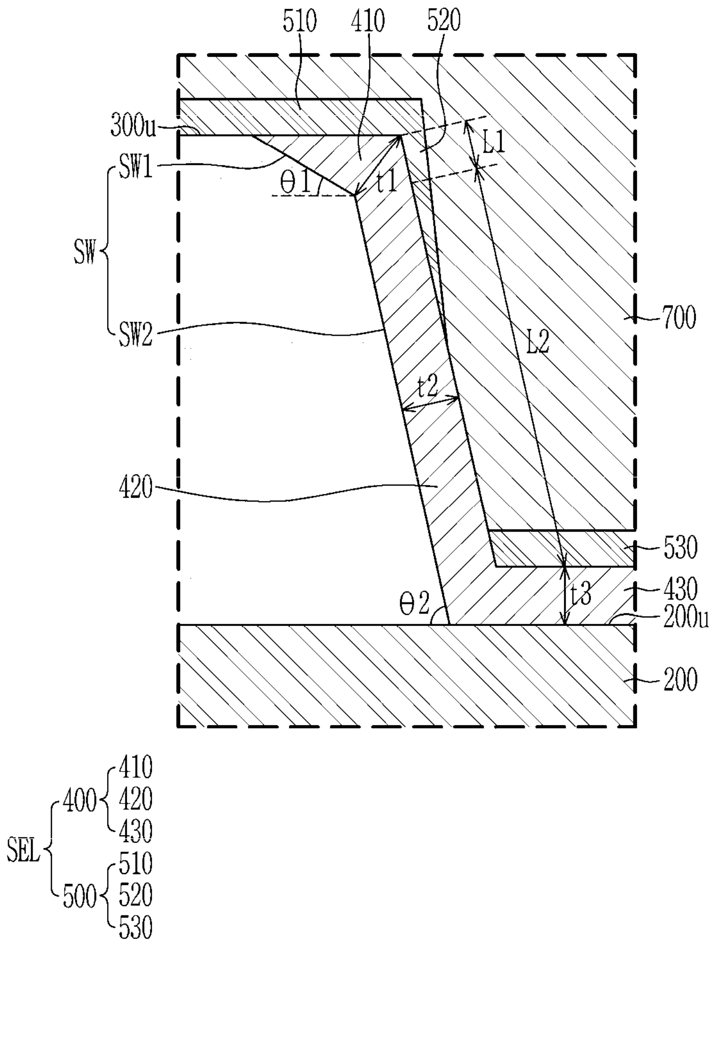
FIG. 2 is an enlarged cross-sectional view of part A of FIG. 1.

FIG. 1 is a cross-sectional view of a circuit board according to an embodiment. FIG. 2 is an enlarged cross-sectional view of part A of FIG. 1.

As shown in FIG. 1 and FIG. 2, a circuit board according to an embodiment includes a first insulation layer 100, a circuit wire 200, a second insulation layer 300, a first seed layer 400, a second seed layer 500, a third seed layer 600, a first conductive layer 700, and a second conductive layer 800.

The first insulation layer 100 may include a thermosetting resin such as an epoxy resin, a polyimide, or the like, a thermoplastic resin such as polyethylene (PE), polycarbonate (PC), polyvinyl chloride (PVC), or the like, or a resin including reinforcing members such as fiberglass or inorganic fillers in combination therewith. For example, the first insulation layer 100 may include a prepreg, ABF (Ajinomoto Buildup Film), PID (Photo Image-able Dielectric), or the like.

The circuit wire 200 is positioned on the first insulation layer 100 and may carry electrical signals. The circuit wire 200 may be disposed in various patterns. The circuit wire 200 may include a conductive material such as copper (Cu), aluminum (Al), silver (Ag), tin (Sn), gold (Au), nickel (Ni), lead (Pb), titanium (Ti), or an alloy thereof.

While the circuit wire 200 is shown in one layer in the present embodiment, it is not necessarily limited thereto, and may be disposed in a plurality of layers.

The second insulation layer 300 may have a via hole VH covering the circuit wire 200 and overlapping a portion of the circuit wire 200. The second insulation layer 300 may include a thermosetting resin such as an epoxy resin, a polyimide, or the like, a thermoplastic resin such as polyethylene (PE), polycarbonate (PC), polyvinyl chloride (PVC), or the like, or a resin including reinforcing members such as fiberglass or inorganic fillers in combination therewith. For example, the second insulation layer 300 may include a prepreg, ABF (Ajinomoto Buildup Film), PID (Photo Image-able Dielectric), or the like. Particularly, ABF may be a polymeric epoxy film available from Ajinomoto Fine-Techno Company, Inc.

The via hole VH of the second insulation layer 300 may have a tilted side wall SW. The side wall SW of the via hole VH may include a first side wall SW1 and a second side wall SW2 having different tilt angles with respect to a surface, for example, an upper part surface, of the circuit wire 200 and extending in the thickness direction of the first insulation layer 100.

The first side wall SW1 may be an upper part side wall extending from an upper part surface 300*u* of the second insulation layer 300, and the second side wall SW2 may be a lower part side wall extending from the first side wall SW1 to an upper part surface 200*u* of the circuit wire 200. The second side wall SW2 occupies most of the side wall SW, and the maximum length L2 of the second side wall SW2 may be longer than the maximum length L1 of the first side wall SW1. The first side wall SW1 may be a recess portion, such as a crevice, that occurs in a desmear process of removing residues generated on the side wall of the via hole VH, such as smear, using chemicals. The first side wall SW1 and the second side wall SW2 may have an acute angle in a counterclockwise direction relative to the upper part surface 200*u* of the circuit wire 200. In this case, a first tilt angle θ1 of the first side wall SW1 relative to the upper surface 200*u* of the circuit wire 200 may be smaller than a second tilt angle θ2 of the second side wall SW2.

The first seed layer 400 may cover the side wall SW of the via hole VH and the upper part surface 200*u* of the circuit wire 200. The first seed layer 400 may include a first upper part seed layer 410 covering the first side wall SW1, a first lower part seed layer 420 covering the second side wall SW2, and a first bottom seed layer 430 covering the upper part surface 200*u* of the circuit wire 200. The first upper part seed layer 410, the first lower part seed layer 420, and the first bottom seed layer 430 may be formed integrally and continuously.

Here, the first seed layer 400 is formed by a chemical copper plating process, thus the maximum thickness t2 of the first lower part seed layer 420 is the same as the maximum thickness t3 of the first bottom seed layer 430, and the thickness of the first bottom seed layer 420 may be uniform.

In addition, the first tilt angle θ1 of the first side wall SW1 has a smaller crevice shape than the second tilt angle θ2 of the second side wall SW2, thus the maximum thickness t1 of the first upper part seed layer 410 positioned on the crevice-shaped first side wall SW1 may be thicker than the maximum thickness t2 of the first lower part seed layer 420. In one example, a thickness of a portion of the seed layer may refer to a thickness of the portion of the seed layer in a direction perpendicular to a corresponding portion of the wall on which the portion of the seed layer is disposed.

The second seed layer 500 is positioned in the via hole VH and may cover the first seed layer 400.

The second seed layer 500 may include a second upper part seed layer 510 covering a portion of the upper part surface 300*u* of the second insulation layer 300 and the first upper part seed layer 410, a second lower part seed layer 520 covering a portion of the first lower part seed layer 420, and a second bottom seed layer 530 covering the first bottom seed layer 430.

Here, the second seed layer 500 is formed by patterning a sputtering seed layer 60 (see FIG. 6) formed in the sputtering process, thus the thickness t2 of the second lower part seed layer 520 positioned relative to the tilted second side wall SW2 may not be uniform.

Like this, even if the thickness t2 of the second lower part seed layer 520 of the second seed layer 500 is not uniform, the thickness of the first lower part seed layer 420 of the first seed layer 400 is uniform, thus the first lower part seed layer 420 may cover all of the tilted second side wall SW2 of the via hole VH.

The second seed layer 500 may be formed from a bilayer of titanium (Ti) and copper (Cu).

Further, the thickness of the second seed layer 500 may be thinner than the thickness of the first seed layer 400. For example, the first seed layer 400 may have a thickness of 500 nm to 800 nm, and the second seed layer 500 may have a thickness of 200 nm or less.

The third seed layer 600 may be positioned on a portion of the upper part surface 300*u* of the second insulation layer 300. The third seed layer 600 is simultaneously formed with the second seed layer 500 by patterning the sputtering seed layer 60 (see FIG. 6) formed in the sputtering process, and thus may include the same material as the second seed layer 500. The thickness of the third seed layer 600 may be thinner than the thickness of the first seed layer 400. The third seed layer 600 may be formed from a bilayer of titanium (Ti) and copper (Cu).

The first separator 700 may be positioned on the second seed layer 500. The first conductive layer 700 may be formed by a chemical plating process using a seed layer (SEL) including the first seed layer 400 and the second seed layer 500 as a seed. The first conductive layer 700 may fill the via hole VH to form via. The first conductive layer 700 may be made of a material such as copper (Cu).

Like this, the first conductive layer 700 is formed inside the via hole VH using the seed layer SEL including the first seed layer 400 and the second seed layer 500 covering both side walls SW of the via hole VH as a seed, thus no unplated regions occur inside the via hole VH. Therefore, it is possible to minimize the occurrence of voids and other defects inside the via hole VH.

The second conductive layer 800 may be positioned on the third seed layer 600. The second conductive layer 800 is formed at the same time in the chemical plating process forming the first conductive layer 700, so the second conductive layer 800 may include the same material as the first conductive layer 700.

Referring to FIG. 3 to FIG. 7 in conjunction with FIG. 1 and FIG. 2, a manufacturing method of a circuit board according to an embodiment will be described in detail.

FIG. 3 to FIG. 7 are cross-sectional views illustrating a manufacturing method of a circuit board according to an embodiment.

Figure 3:
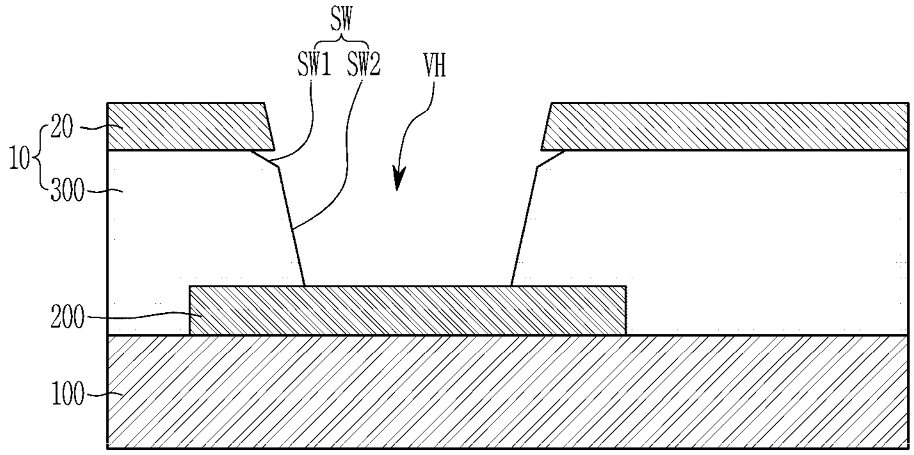
FIG. 3 to FIG. 7 are cross-sectional views illustrating a manufacturing method of a circuit board according to an embodiment.

As shown in FIG. 3, the circuit wire 200 is formed on the first insulation layer 100. Then, an insulation layer 10 covering the circuit wire 200 is formed on the first insulation layer 100. The insulation layer 10 may include a second insulation layer 300, and a protection film 20 covering the second insulation layer 300. In the present embodiment, the second insulation layer 300 includes, but is not necessarily limited thereto, ABF, and may be made of a variety of materials. In addition, in the present embodiment, the protection film 20 includes, but is not necessarily limited thereto, PET, and may be made of a variety of materials.

Then, a via hole VH overlapping a portion of the circuit wire 200 is formed in the insulation layer 10 using a laser processing process. In the laser processing process of the present embodiment, a $CO_2$ laser may be used, but the present embodiment is not limited thereto, and the laser processing process may be performed using various lasers.

Then, residues, such as smears, generated inside the via hole VH is removed using a surface treatment process, such as a desmear process. In such a surface treatment process, the concave first side wall SW1 may be formed on a portion of the side wall SW of the via hole VH adjacent to the protection film 20. The first tilt angle θ1 of the first side wall SW1 may be smaller than the second tilt angle θ2 of the second side wall SW2 which is the remaining portion.

Figure 4:
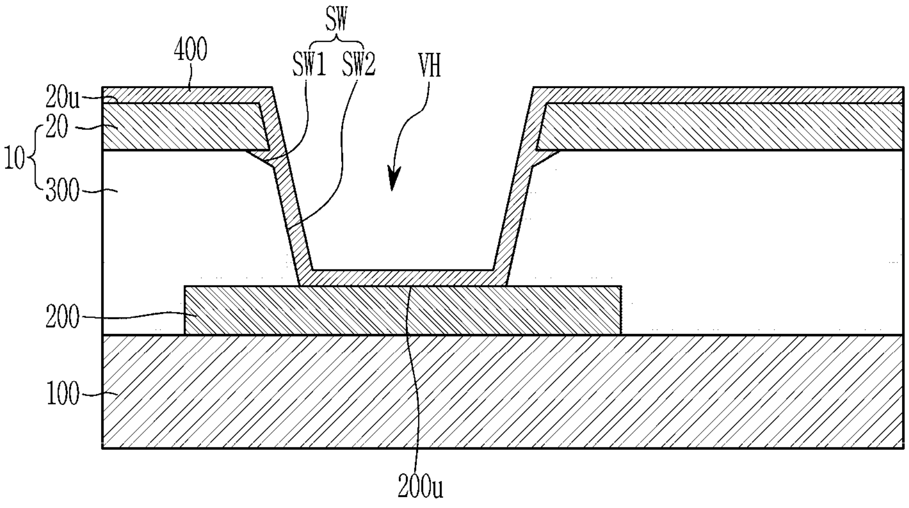

As shown in FIG. 4, the first seed layer 400 covering the side wall SW of the via hole VH and an upper part surface 20*u* of the protection film 20 is formed using a chemical copper plating process. Specifically, the first seed layer 400 may cover the upper part surface 20*u* of the protection film 20, the first side wall SW1, the second side wall SW2, and the upper part surface 200*u* of the circuit wire 200 exposed by the via hole VH.

Figure 5:
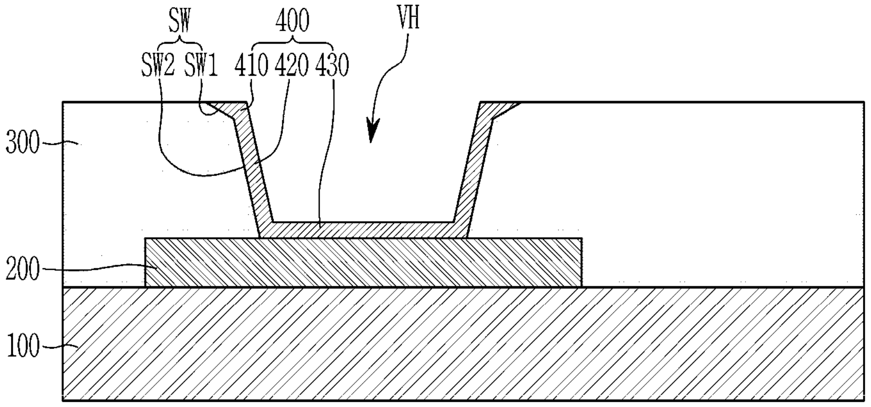

As shown in FIG. 5, the protection film 20 is removed. At this time, a portion of the first seed layer 400 covering the upper part surface 20*u* of the protection film 20 may be removed along with the protection film 20. Since the first side wall SW1 is formed inside the via hole VH, and the protection film 20 and the second insulation layer 300 are already partially separated, it is easy to separate the protection film 20 from the second insulation layer 300, thus, the first seed layer 400 in the via hole VH is not damaged by tearing. Thus, the first seed layer 400 is not positioned on the upper part surface 300*u* of the second insulation layer 300. That is, the first seed layer 400 may include the first upper part seed layer 410 covering the first side wall SW1, the first lower part seed layer 420 covering the second side wall SW2, and the first bottom seed layer 430 covering the upper part surface 200*u* of the circuit wire 200.

Figure 6:
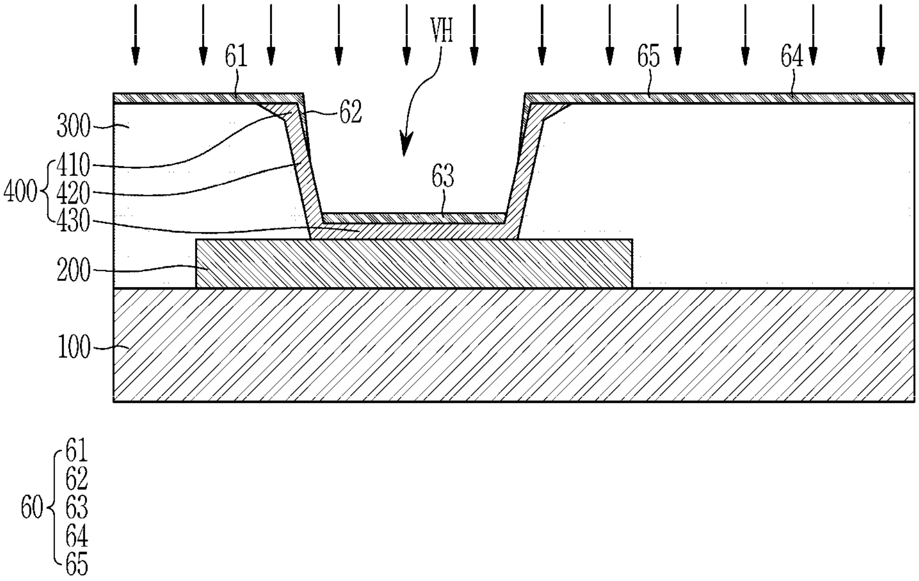

As shown in FIG. 6, the sputtered seed layer 60 is formed using a sputtering process. The sputtering seed layer 60 may include first portions 61, 62, and 63 covering the first seed layer 400 positioned in the via hole VH, a second portion 64 covering the upper part surface 300*u* of the second insulation layer 300 and corresponding to the second conductive layer 800 to be formed in a later process, and a third portion 65 covering the upper part surface 300*u* of the second insulation layer 300 and to be removed in a later process. The thickness of the portion 62 of such sputtering seed layer 60 positioned on the side wall of the via hole VH may not be uniform. In other words, since the side wall SW of the via hole VH has a tilted shape, the thickness of the portion 62 positioned on the tilted side wall SW of the sputtering seed layer 60 sputtered vertically downward may not be uniformly formed.

Figure 7:
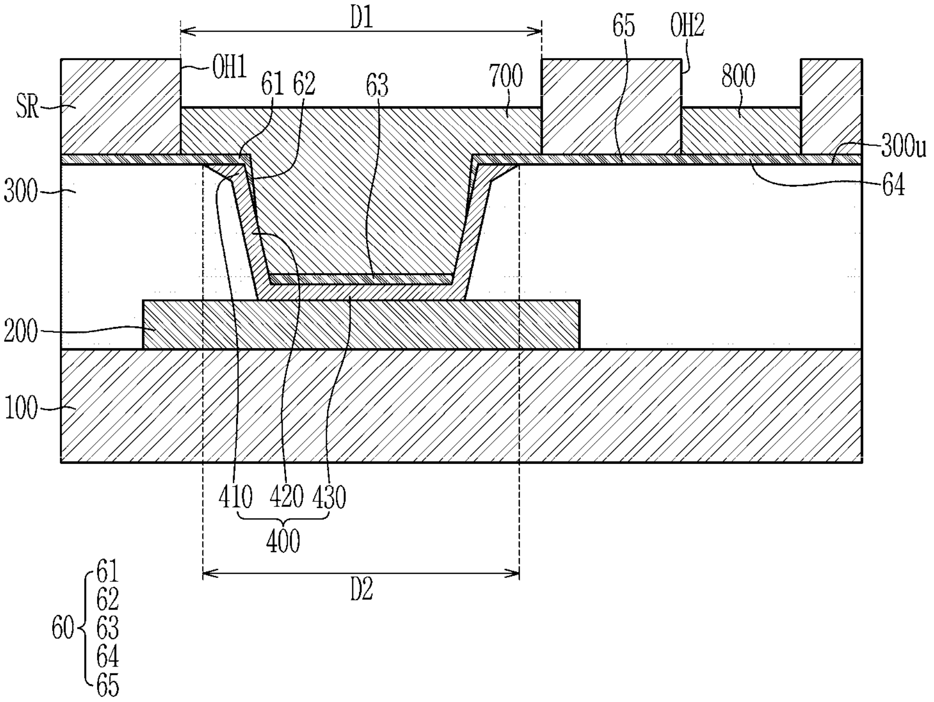

As shown in FIG. 7, a resist layer SR is formed on the sputtering seed layer 60. The resist layer SR may have a first opening OH1 corresponding to the first conductive layer 700 and a second opening OH2 corresponding to the second conductive layer 800. The first opening OH1 is positioned overlapping with the via hole VH, and the maximum width D1 of the first opening OH1 may be larger than the maximum width D2 of the via hole VH.

Then, the first conductive layer 700 is formed on the first portions 61, 62, 63 of the sputtering seed layer 60 exposed by the first opening OH1, and the second conductive layer 800 is formed on the second portion 64 of the sputtering seed layer 60 exposed by the second opening OH2 using a plating process. Therefore, the first conductive layer 700 and the second conductive layer 800 may be made of the same material. In this case, as the maximum width D1 of the first opening OH1 is larger than the maximum width D2 of the via hole VH, the first conductive layer 700 formed in the first opening OH1 may completely fill the via hole VH.

As shown in FIG. 1 and FIG. 2, the resist layer SR is removed. Then, the second seed layer 500 and the third seed layer 600 are formed by removing the third portion 65 of the sputtering seed layer 60 exposed to the outside, except for the first portions 61, 62, and 63 and the second portion 64 of the sputtering seed layer 60 positioned to overlap under the first conductive layer 700 and the second conductive layer 800, respectively. The second seed layer 500 is formed inside the via hole VH and positioned on the first seed layer 400. Here, the second seed layer 500 may include a second upper part seed layer 510 covering the upper part surface 300*u* of the second insulation layer 300 and the first upper part seed layer 410, a second lower part seed layer 520 covering a portion of the first lower part seed layer 420, and a second bottom seed layer 530 covering the first bottom seed layer 430. Here, the thickness of the second bottom seed layer 520 may be not uniform. The third seed layer 600 is positioned on the upper part surface 300*u* of the second insulation layer 300.

Like this, in an embodiment, by performing a chemical copper plating process inside the via hole VH to form the first seed layer 400 before peeling off the protection film 20 attached to the upper part surface 300*u* of the second insulation layer 300, and performing a sputtering process to form the second seed layer 500 on the first seed layer 400, thereby improving the coverage of the seed layers 400, 500 inside the via hole VH.

Therefore, the occurrence of unplated regions inside the via hole VH can be minimized to minimize defects, thereby ensuring the reliability of the conductive layer 700 positioned inside the via hole VH.

In addition, by the protection film 20 attached to the upper part surface 300*u* of the second insulation layer 300 except for the via hole VH, the first seed layer 400 by the chemical copper plating process is not formed on the upper part surface 300*u* of the second insulation layer 300, but only the second seed layer by the sputtering process is formed, thus the thickness of the second seed layer 500 on the upper part surface 300*u* of the second insulation layer 300 can be reduced, making it easier to implement microcircuit patterns.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A circuit board, comprising:

a first insulation layer;

a circuit wire positioned on the first insulation layer;

a second insulation layer covering at least a portion of the circuit wire and overlapping at least a portion of the circuit wire, and having a via hole including a first side wall and a second side wall having different tilt angles, the via hole extending in a thickness direction of the first insulation layer;

a first seed layer covering the first side wall and the second side wall of the via hole;

a second seed layer positioned in the via hole and covering the first seed layer;

a third seed layer positioned on an upper surface of the second insulation layer and including the same material as the second seed layer;

a first conductive layer positioned on the second seed layer; and a second conductive layer positioned on the third seed layer, wherein the first seed layer includes a first side surface facing the first side wall of the via hole and a second side surface facing the second seed layer, and with respect to an upper part surface of the circuit wire, a first tilt angle of the first side wall of the via hole is smaller than a tilt angle of the second side surface of the first seed layer.

2. The circuit board of claim 1, wherein:

the first side wall extends from the upper surface of the second insulation layer, and the second side wall extends from the first side wall to the upper part surface of the circuit wire.

3. The circuit board of claim 2, wherein:

the first tilt angle of the first side wall relative to the upper part surface of the circuit wire is smaller than a second tilt angle of the second side wall.

4. The circuit board of claim 2, wherein:

a length of the first side wall is shorter than a length of the second side wall.

5. The circuit board of claim 2, wherein:

the first seed layer comprises:

a first upper part seed layer covering the first side wall;

a first lower part seed layer covering the second side wall; and a first bottom seed layer covering the upper part surface of the circuit wire, a thickness of the first bottom seed layer is uniform.

6. The circuit board of claim 5, wherein:

a maximum thickness of the first upper part seed layer is thicker than a maximum thickness of the first lower part seed layer.

7. The circuit board of claim 5, wherein:

the second seed layer comprises:

a second upper part seed layer covering the first upper part seed layer;

a second lower part seed layer covering the first lower part seed layer; and a second bottom seed layer covering the first bottom seed layer, a thickness of the second lower part seed layer decreases in a direction from the upper surface of the second insulation layer to a bottom of the via hole.

8. The circuit board of claim 1, wherein:

the first conductive layer and the second conductive layer include the same material.

9. A circuit board, comprising:

a first insulation layer;

a circuit wire positioned on the first insulation layer;

a second insulation layer covering at least a portion of the circuit wire and overlapping at least a portion of the circuit wire, and having a via hole including a first side wall and a second side wall having different tilt angles, the via hole extending in a thickness direction of the first insulation layer;

a first seed layer covering the first side wall and the second side wall of the via hole;

a second seed layer positioned in the via hole and covering the first seed layer;

a third seed layer positioned on an upper surface of the second insulation layer and including the same material as the second seed layer;

a first conductive layer positioned on the second seed layer; and a second conductive layer positioned on the third seed layer, wherein the first conductive layer is in contact with a portion of the first seed layer.

10. A circuit board, comprising:

a first insulation layer;

a circuit wire positioned on the first insulation layer;

a second insulation layer having a via hole covering at least a portion of the circuit wire and overlapping at least a portion of the circuit wire;

a first seed layer covering a side wall of the via hole;

a second seed layer positioned in the via hole and covering the first seed layer;

a third seed layer positioned on an upper surface of the second insulation layer and including the same material as the second seed layer;

a first conductive layer positioned on the second seed layer; and a second conductive layer positioned on the third seed layer, wherein a thickness of the second seed layer decreases in a direction from the upper surface of the second insulation layer to a bottom of the via hole.

11. The circuit board of claim 10, wherein:

wherein a thickness of the third seed layer is thinner than a thickness of the first seed layer.

12. The circuit board of claim 10, wherein:

the second conductive layer includes the same material as the first conductive layer.

* * * * *